United States Patent [19]

Athanas et al.

[11] 3,765,970

[45] Oct. 16, 1973

[54] METHOD OF MAKING BEAM LEADS FOR SEMICONDUCTOR DEVICES

[75] Inventors: Terry George Athanas, Lebanon; Angelo Antonio Anastasio, Trenton, both of N.J.

[73] Assignee: RCA Corporation, New York, N.Y.

[22] Filed: June 24, 1971

[21] Appl. No.: 156,398

[52] U.S. Cl. ........................ 156/17, 29/578, 29/580, 317/234

[51] Int. Cl. ............................ H01l 7/00, H01l 7/50

[58] Field of Search ................ 156/17; 29/578, 580; 317/234

[56] References Cited

UNITED STATES PATENTS

| | | | |
|---|---|---|---|
| 3,335,338 | 8/1967 | Lepselter | 317/234 |
| 3,421,985 | 1/1969 | Baker et al. | 204/15 |
| 3,535,176 | 10/1970 | Whoriskey | 156/17 |

*Primary Examiner*—Jacob H. Steinberg
*Attorney*—Glenn H. Bruestle and H. Christoffersen

[57] ABSTRACT

Cantilevered beam leads are formed on a semiconductor wafer by a process which includes the steps of evaporating titanium, palladium, and gold in a single pump-down of the evaporation apparatus. Prior to the application of these layers, the contact areas of the device are conditioned for ohmic contact by depositing an aluminum layer on the wafer and then heating the wafer in a non-oxidizing atmosphere to form an aluminum-silicon alloy in the contact regions. Any unalloyed aluminum is then removed and the evaporated beam lead system is deposited. Thereafter the metallization pattern is defined photolithographically.

15 Claims, 7 Drawing Figures

2 Sheets-Sheet 1

INVENTORS
TERRY GEORGE ATHANAS &
ANGELO ANTONIO ANASTASIO
BY Glenn H. Bruestle
ATTORNEY INVENTORS.
TERRY GEORGE ATHANAS &
ANGELO ANTONIO ANASTASIO
BY Glenn H. Bruestle
ATTORNEY

METHOD OF MAKING BEAM LEADS FOR SEMICONDUCTOR DEVICES

BACKGROUND OF THE INVENTION

This invention relates to semiconductor devices and pertains more particularly to a method of making cantilevered beam leads for semiconductor devices.

Beam leads for semiconductor devices and several methods of fabricating them are known. All the known processes begin with a semiconductor wafer which has an insulating coating on its surface and apertures in the insulating coating where contact to the semiconductor is desired. In one known process, a region of platinum silicide is first formed in the semiconductor wafer at the contact regions by sputtering a layer of platinum onto the device and then reacting the platinum with the silicon. Then, a continuous layer of titanium is deposited and a continuous layer of platinum is deposited on the titanium layer. Photolithographic processes are next employed to define the desired lead pattern in the platinum layer. Thereafter, a photoresist coating is applied to the titanium areas which are not covered with platinum, and gold is electroplated onto the platinum leads. Finally, the titanium which is not covered by the leads is removed. In this metallization system, the titanium layer serves to promote adhesion to the semiconductor wafer, the platinum layer is a barrier against migration of gold into the semiconductor, and the gold layer provides physical strength and high electrical conductance. Difficulties with this arrangement are that special sputtering equipment is required for the platinum deposition process, and the pre-treatment material, platinum, is relatively expensive. Also, owing to possible inaccuracies of the positioning of the mask used to prevent plating of gold onto the titanium layer, some gold can be plated onto the titanium which gives rise to the possibility of the gold migrating through the titanium and into the wafer. This, as known, is undesirable. This problem is somewhat reduced according to the prior art process, however, since the platinum-silicide is a barrier to gold diffusion.

Other schemes for forming beam leads are known. For example, it is not necessary to first define the platinum layer, i.e. the electroplated gold may be formed on a continuous masked platinum layer which is defined after the gold plating step. See M.P. Lepselter, Bell Systems Technical Journal, volume 45, page 233 (1966). This procedure was used in the art prior to the one described above but has not found favor because it is difficult to remove the portion of the platinum layer which is exposed after the plating of the gold layer without adversely affecting the gold layer. It is also known to evaporate all three of the beam lead layers before definition of the lead pattern. See Hunter, Handbook of Semiconductor Electronics, Third edition, McGraw Hill, New York, 1970, pages 8–26 to 8–30.

In all of the beam lead systems, as applied to silicon, it is necessary to condition the silicon surface for ohmic contact. The lowermost layer in the system, titanium, is not a good contact material for unprepared silicon. The art has usually relied on the platinum silicide process which, as described above, includes sputtering as one of its steps. The sputtering process, however, is not compatible with all semiconductor devices. For example, it is not applicable to MOS devices. The sensitive and critical gate insulator cannot withstand the mechanical forces involved. Alternative surface preconditioning processes have been attempted for MOS devices but none has proved reliable. For example, electroless or resistance evaporated palladium has been applied and the device has then been heated to react the palladium with the silicon body to form a palladium silicide. The results have not been reproducible, however.

Another known surface conditioning treatment is to deposit aluminum by evaporation onto a heated silicon wafer at such a temperature that an aluminum-silicon alloy is formed. See U.S. Pat. 3,535,176 to Whoriskey. This preconditioning treatment is disclosed in combination with nickel metallization. While this form of aluminum-silicon alloy preconditioning is a known alternative for providing ohmic contact between nickel and silicon, it has not been used in combination with beam leads. It is known that, unlike platinum silicide, this alloy is not a barrier to gold, and workers in the art have believed that, for the reasons previously described, the surface preconditioning treatment for a beam lead system must provide such a barrier.

THE DRAWINGS

FIG. 1 is a partial cross sectional view of a semiconductor integrated circuit device having beam lead metallization in assembled relation to a printed circuit board.

FIGS. 2 through 7, inclusive, are a sequence of cross sectional views showing a semiconductor wafer in several steps of one embodiment of the present novel process.

DETAILED DESCRIPTION

Figure 1:
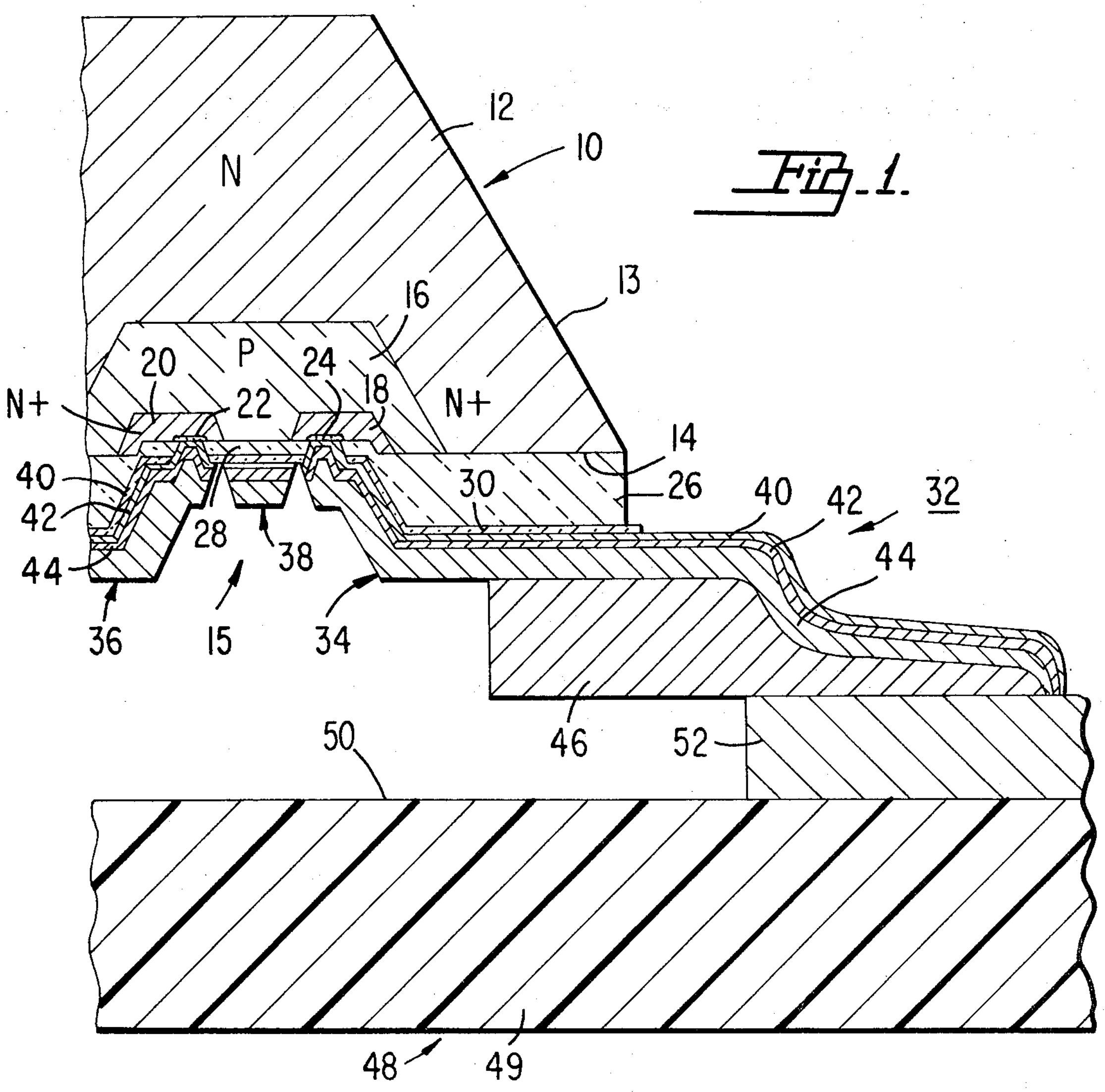

A portion of a completed device 10 made by the present novel process is shown in FIG. 1 in its assembled relation on a printed circuit board. The device 10 includes a body 12 of monocrystalline semiconductive material, typically silicon, which is initially of one type conductivity, N type in this example. In FIG. 1 one edge 13 of the body 12 is shown. The body 12 has a surface 14 adjacent to which the circuit elements of the device are formed. In the operative position of the device 10 as shown in FIG. 1, the surface 14 is the lower surface of the body 12.

One MOS transistor 15 is shown in FIG. 1. The transistor 15 is comprised of a P type well region 16 formed by diffusion of conductivity modifiers into the body 12 through the surface 14. Within the well region 16 are spaced N+ type source and drain regions 18 and 20, also formed by diffusion. Within the regions 18 and 20 are regions 22 and 24 which are composed of an aluminum-silicon alloy and serve to promote ohmic contact between the metallization system, to be described below, and the material of the body 12.

On the surface 14 of the body 12 is a relatively thick insulating coating 26, usually silicon dioxide. Adjacent to the source and drain regions 18 and 20 and to the space between them is a relatively thin, clean insulator 28 which has the appropriate characteristics to serve as a gate insulator. While these two coatings 26 and 28 are formed at different times and are really separate coatings, they are shown as integral in the drawings because they are both of the same material.

A layer 30, of silicon nitride, is shown on the silicon dioxide layers 26 and 28 in FIG. 1. This layer is optional. It provides somewhat better protection of the semiconductor from outside contaminants than is provided by the silicon dioxide coatings alone.

The beam lead metallization system is designated generally in FIG. 1 by the reference numeral 32. As shown, the system 32 includes a source lead 34, which extends beyond the edge 13 of the body, a drain lead 36, and a gate electrode 38. Each of these elements is comprised of a layer 40 of titanium, a layer 42 of platinum or palladium, and a layer 44 of gold. Adjacent to the cantilevered portion of the source lead 34, a relatively thick electroplated gold layer 46 is provided to give mechanical rigidity and strength thereto. A similar electroplated layer is provided on the other cantilevered leads (not shown) of the device 10 as well.

The device 10 is mounted on a printed circuit board 48 which includes an insulating substrate 49 carrying, on a surface 50 thereof, a pattern of interconnection conductors, one element of which is shown at 52. In assembly, the device 10 is inverted into the position shown and placed with its beam leads in contact with the appropriate conductors. Thereafter, the beam leads are welded to the conductors with a tool which compresses the leads against the circuit board metallization, as shown.

EXAMPLE OF THE PROCESS

The following steps, described with reference to FIGS. 2 to 7, include one embodiment of the present novel method. It will be understood that conventional steps of cleaning and rinsing the semiconductor wafer are performed between the stated steps.

Step 1. Process an integrated circuit wafer 54. (FIG. 2) uusually containing a plurality of devices 10, conventionally up to and including the step of forming the source and drain regions of the transistors in the devices 10.

Figure 2:
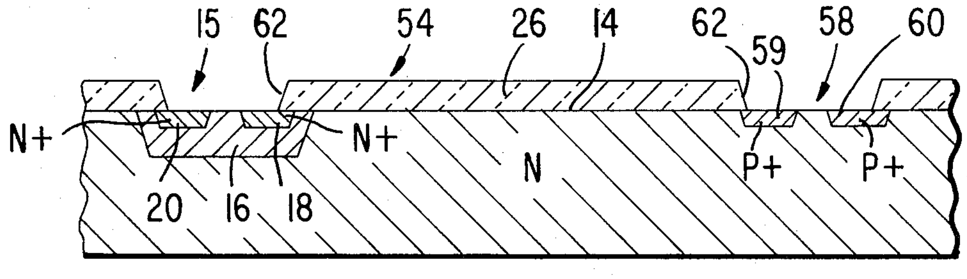

The portion of the wafer 54 shown in FIG. 2 will eventually become the edge portions of two separate devices 10. As shown, the wafer 54 is of N type conductivity and includes, adjacent to the surface 14 thereof, elements of an N channel transistor which may be the transistor 15 of FIG. 1 and which thus comprises a diffused P well 16 and spaced source and drain regions 18 and 20. Adjacent to its right side in FIG. 2 the wafer 54 includes portions of a P channel transistor 58 comprising spaced P+ type source and drain regions 59 and 60. There is also a relatively thick oxide coating 26 which has openings 62 overlying the elements of the two transistors.

Step 2. Form the gate insulators 28. See FIG. 3.

To form the gate insulators 28 of the several transistors, the wafer 54 is heated in an oxidizing atmosphere such as an azeotropic mixture of steam and gaseous hydrochloric acid. The wafer 54 is heated to a temperature of 875°C in this atmosphere for a sufficient time to produce on the areas within the openings 62 oxide coatings 28 of approximately 800 A in thickness. Next, the coatings 28 are annealed at about 1000°C in a reducing atmosphere, such as forming gas, or in an inert atmosphere, such as argon.

This process consumes a portion of the silicon within the openings 62, providing the indented configuration shown in the drawings.

Step 3. Deposit the layer 30 of insulating silicon nitride on the wafer. See FIG. 3.

This may be accomplished by heating the wafer 54 to a temperature of about 800°C in an atmosphere comprising silane ($SiH_4$) and ammonia for a period of about 15 minutes to grow the coating 30 to a thickness of about 500 A.

Step 4. Deposit a layer 64 of silicon dioxide on the silicon nitride layer 30 and densify it. See FIG. 3.

This may be accomplished by heating the wafer 54 to a temperature of about 350°C in an atmosphere comprising silane ($SiH_4$) and oxygen for a time sufficient to grow the layer 64 to a thickness of about 2000 A. A deposited coating of this kind is relatively porous and should be densified by heating the wafer, for example, to a temperature of about 1000°C in oxygen for about 10 minutes. The oxide coating 64 is not part of the final device. It will be, in the next two steps, an etch resistant mask for the silicon nitride layer 30. The reason the silicon dioxide layer 64 is used is because the usual organic photoresists cannot be used directly for silicon nitride because they are not compatible with the solvents for silicon nitride, e.g. phosphoric acid.

Step 5. Apply a photoresist coating 66 and expose it to define contact opening areas 68. See FIG. 3.

Any conventional photolithographic process may be used.

Step 6. Etch the silicon dioxide coating 64 exposed through the openings 68, remove the photoresist coating 66, and etch the silicon nitride layer 30 in the contact ares 68. The configuration of the wafer after the performance of this step is not illustrated.

The silicon dioxide of the coating 64 may be etched in buffered HF solution, i.e. a solution of hydrofluoric acid and ammonium fluoride, at room temperature. This solution does not attack silicon nitride. The photoresist coating 66 is next removed in a suitable solvent. The silicon nitride of the coating 30 may then be etched in phosphoric acid at about 180°C. While the configuration of the wafer 54 at the conclusion of this step is not shown in the drawings, it will be understood that the silicon dioxide coating 28 is not materially affected by the phosphoric acid and thus the etching will stop when this material is reached.

Step 7. Remove the silicon dioxide layer 64 and simultaneously complete the opening of the contact areas. See FIG. 4.

The wafer 54 should next be exposed to a solvent for silicon dioxide, such as buffered HF solution, to remove the silicn dioxide layer 28 in the contact areas 68 and the silicon dioxide layer 64 surrounding the areas 68. This etching is self-limiting and stops when the silicon nitride coating 30 is exposed and when the surface of the silicon is exposed.

Step 8. Evaporate a layer 70 of aluminum. See FIG. 4.

The aluminum layer 70 is deposited on the wafer 54 in a vacuum evaporation apparatus in conventional manner. The wafer 54 is preferably at about room temperature during this step. The layer 70 is grown to a thickness of about 2000 A.

Step 9. Heat the wafer 54 to alloy the aluminum of the layer 70 with the silicon in the contact regions to form the alloy regions 22 and 24 and other alloy regions in the other transistors. See FIG. 4.

This step may be carried out by heating the wafer 54 to a temperature between about 400°C and about 500°C, preferably 450°C, in a non-oxidizing atmosphere, for about 15 minutes. The atmosphere may be a reducing atmosphere such as forming gas or an inert atmosphere such as argon.

Step 10. Remove the unalloyed aluminum.

The wafer 54 is next immersed in phosphoric-nitric acid at about 75°C until the unalloyed aluminum is removed.

Step 11. Deposit on the wafer 54 by vacuum evaporation the layer 40 of titanium, the layer 42 of palladium (or platinum, if desired), and the layer 44 of gold. See FIG. 5.

These evaporations may be carried out conventionally but should be done in a single pump-down of the vacuum system to avoid contamination. While in no way critical, the titanium layer 40 is preferably about 600 A thick; the layer 42 of palladium is preferably abou 1000 A thick; and, the layer 44 of gold is preferably about 10,000 A thick. As shown, the palladium layer 42 completely covers the titanium layer and prevents any contact of the gold layer 44 with the titanium layer. This prevents the possibility, as in the prior art process previously described, of the gold migrating into the silicon wafer.

Step 12. Apply a photoresist coating 72 and expose it to define portions of the layers 40, 42, and 44 to provide the desired lead pattern. See FIG. 5.

Figures 3, 4, 5, 6, 7:
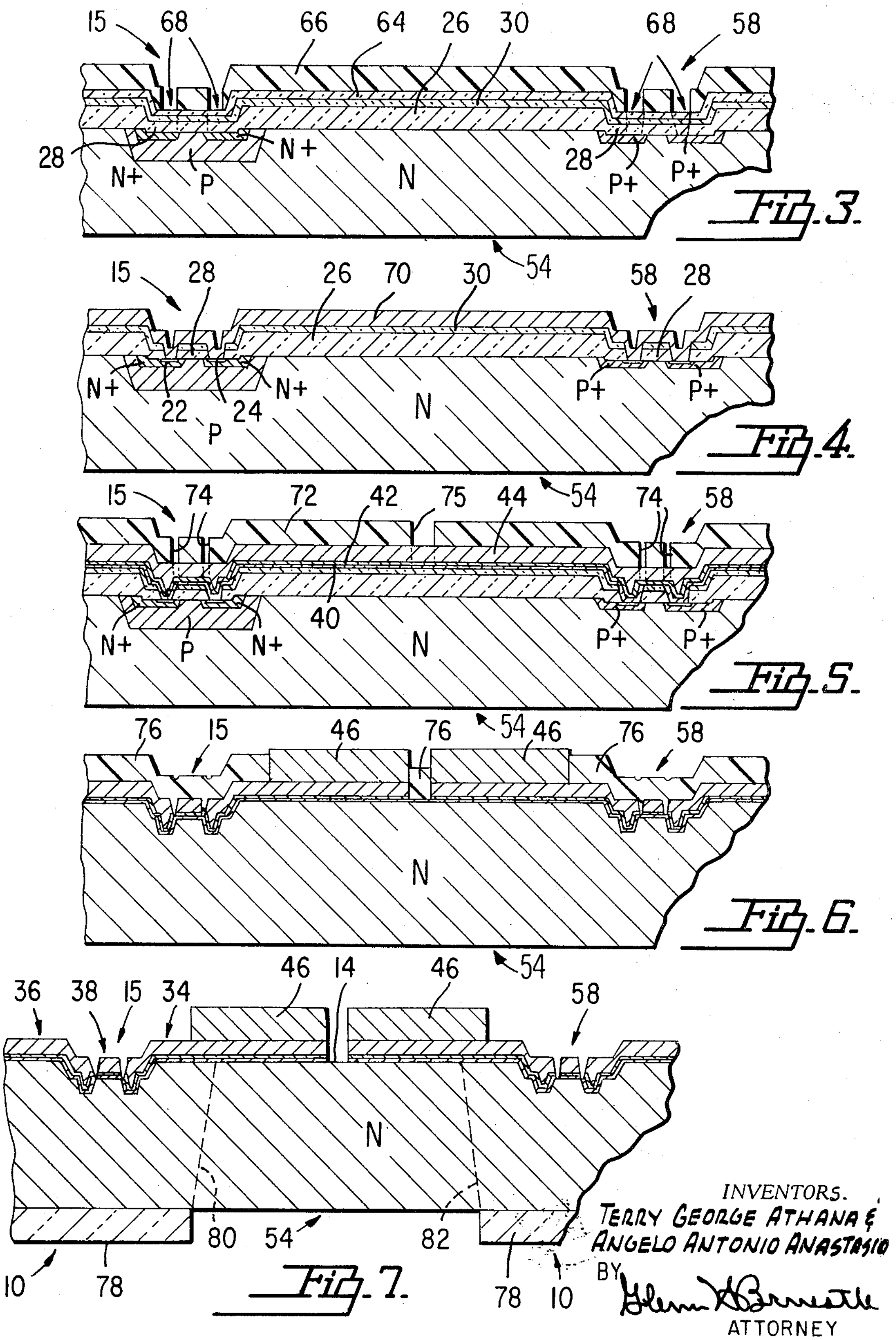

This step may be carried out conventionally. As shown in FIG. 5, the coating 72 has openings 74 to define the areas of separation between the source and drain leads and the gate electrodes of the devices, and an opening 75 which defines the ends of the beam leads of adjacent devices.

Step 13. Etch the unmasked gold and palladium. See FIG. 6.

This step may be carried out by immersing the wafer 54 in commercially available "C-35" solvent, at room temperature. "C-35" solvent, consisting of potassium iodiode and free iodine in water, adjusted to the proper pH, is manufactured by Film Micro Electronics Inc., Burlington, Massachusetts. The photoresist coating 72 is then removed.

Step 14. Apply a photoresist coating 76, leaving uncovered the portions of the beam leads which will be cantilevered. See FIG. 6.

This step may be carried out conventionally. The uncovered lead portions should be remote from the devices on the wafer 54 and preferably be the eventual cantilevered portions of the leads.

Step 15. Electroplate gold layers 46 onto the unmasked portions. See FIG. 6.

Any conventional gold electroplating process may be used. The titanium layer 40 provides electrical continuity for this process. The photoresist coating 76 is then removed. The reason portions of the leads are masked in the plating step is to avoid plating gold on those areas where the gold is not needed. Also, owing to the small spaces between the leads in these areas, plating gold onto the leads could cause bridging of the lead spaces and shorting of the leads.

Step 16. Etch the exposed titanium. See FIG. 7.

This step may be accomplishd by immersing the wafer in ethyldimethyltetraaetic acid at a temperature of about 56°C. The leads 34 and 36 and the gate electrode 38 as well as all the other interconnection metallization conductors are fully defined at this point.

Step 17. Form a masking oxide coating 78 on the back side of the wafer 54. See FIG. 7.

This step may be carried out conventionally.

Step 18. Etch the wafer 54 to separate the devices 10. See FIG. 7.

This step may be accomplished by immersing the wafer 54 in an anisotropic solvent for silicon such as ethylene diamine tetraaetic acid, hydrazine, or the like. The wafer 54 is oriented so that the surface 14 adjacent to which the devices are formed and the back surface are substantially parallel to the (100) crystallographic planes. The anisotropic etching proceeds rapidly in the (100) direction and does not proceed rapidly in the (111) direction in the crystal so that material is removed substantially along (111) planes suggested by the dashed lines 80 and 82 in FIG. 7. This leaves the devices 10 joined only by the relatively thin coatings 26 and 30. The wafers may be completely separated by etching these coatings away. The devices 10 are now complete and may be assembled onto a printed circuit board, as described above.

With respect to MOS devices, the present process has the particular advantage that the gate insulators 28 are not exposed to the mechanical disrupting influences of the prior platinum sputtering process. Even though an aluminum-silicon alloy is used, which is not a barrier to gold, the danger of the prior art process of gold being electroplated onto the titanium near the contact openings is completely avoided because the entire titanium layer is covered over with palladium or platinum when the first gold layer 44 is applied, and in the later gold plating step the contact areas ae masked by photoresist. Further, the only processes involved are evaporation, etching, and heating, all of which may be accomplished relatively simply in existing apparatus. Specialized apparatus such as sputtering equipment is not required. The present process is not limited to MOS devices and may also be used to form beam leads in the manufacture of bipolar devices.

What is claimed is:

1. A method of forming beam leads on a semiconductor device which includes a body of silicon having a surface, an insulating layer on said surface, and apertures in said insulating layers through which electrical connection can be made to said body, comprising:

forming an aluminum-silicon alloy region in ohmic contact to said body adjacent to said apertures in said insulating layer, depositing, in the named order, a continuous layer of titanium, a continuous layer of platinum or palladium, and a continuous layer of gold on said body, forming an etch resistant coating on said gold layer over predetermined portions of said layers in the desired pattern of said beam leads, and removing, by etching, the unmasked portions of said layers.

2. A method as defined in claim 1 wherein said aluminum-silicon alloy is formed by depositing a layer of aluminum on said body and heating said body to alloy at least some of said aluminum with the silicon of said body.

3. A method as defined in claim 2 wherein said aluminum layer is deposited by vacuum evaporation while said body is at a temperature near room temperature, and said heating step is carried out in a reducing or an inert atmosphere at a temperature between about 400°C and about 500°C.

4. A method as defined in claim 2 comprising the further step of removing any unalloyed aluminum before proceeding to the deposition of said titanium layer.

5. A method as defined in claim 1 wherein the deposition of said titanium, platinum or palladium, and gold layers is carried out by vacuum evaporation of all the named metals during a single pump-down of a vacuum evaporation apparatus.

6. A method as defined in claim 5 further comprising plating an additional gold layer on selected portions of said first mentioned gold layer.

7. A method as defined in claim 6 wherein said body contains, adjacent to said apertures, regions which constitute portions of circuit elements, said selected portions of said first mentioned gold layer being remote from said apertures.

8. A method as defined in claim 5 wherein said aluminum-silicon alloy is formed by depositing a layer of aluminum on said body and heating said body to alloy at least some of said aluminum with the silicon of said body.

9. A method as defined in claim 8 wherein said aluminum layer is deposited by vacuum evaporation while said body is at a temperature near room temperature, and said heating step is carried out in a reducing or an inert atmosphere at a temperature between about 400°C and about 500°C.

10. A method as defined in claim 9 comprising the further step of removing any unalloyed aluminum before proceeding to the deposition of said titanium layer.

11. A method of making a semiconductor integrated circuit device which includes insulated gate field effect transistors each of which comprises spaced source and drain regions within a body of silicon having a surface, an insulating layer on said surface, and a gate electrode on said insulating layer, said device further comprising beam leads in ohmic contact with said source and drain regions comprising forming said insulating layer on the surface of said body, forming apertures in said insulating layer adjacent to said source and drain regions, forming an aluminum-silicon alloy region in ohmic contact to said source and drain regions, depositing a continuous layer of titanium, a continuous layer of platinum or palladium, and a continuous layer of gold on said body, forming an etch resistant coating on said gold layer over predetermined portions of said layers in the desired pattern of said beam leads and said gate electrode, and removing, by etching, the unmasked portions of said layers.

12. A method as defined in claim 11 wherein said aluminum-silicon alloy is formed by depositing a layer of aluminum on said body, and heating said body to alloy at least some of said aluminum with the silicon of said body.

13. A method as defined in claim 12 wherein said aluminum layer is deposited by vacuum evaporation while said body is at a temperature near room temperature, and said heating step is carried out in a reducing or an inert atmosphere at a temperature between about 400°C and about 500°C.

14. A method as defined in claim 12 comprising the further step of removing any unalloyed aluminum before proceeding to the deposition of said titanium layer.

15. A method as defined in claim 11 wherein the deposition of said titanium, platinum or palladium, and gold layers is carried out by vacuum evaporation of all the named metals during a single pump-down of a vacuum evaporation apparatus.

* * * * *